United States Patent [19]

Shin

[11] Patent Number: 4,468,797

[45] Date of Patent: Aug. 28, 1984

[54] SWALLOW COUNTERS

[75] Inventor: Yasuhiro Shin, Tokyo, Japan

[73] Assignee: Oki Electric Industry Co., Ltd., Tokyo, Japan

[21] Appl. No.: 345,532

[22] Filed: Feb. 3, 1982

[30] Foreign Application Priority Data

Feb. 13, 1981 [JP] Japan .................................. 56-18938
Mar. 18, 1981 [JP] Japan .................................. 56-37958

[51] Int. Cl.³ ............................................ H03K 21/30
[52] U.S. Cl. ........................................ 377/52; 377/44; 377/47
[58] Field of Search ........................ 377/47, 44, 52, 39

[56] References Cited

U.S. PATENT DOCUMENTS 4,053,739 10/1977 Miller et al. ............................ 377/47
4,184,068 1/1980 Washburn .............................. 377/52
4,244,027 1/1981 Shai ....................................... 377/44

OTHER PUBLICATIONS

Motorola Semiconductor Products Inc., Phase-Locked Loop: General Information; 1973; pp. 8-11.

Primary Examiner—John S. Heyman
Attorney, Agent, or Firm—Wenderoth, Lind & Ponack

[57] ABSTRACT

The swallow counter includes a two modulus prescaler which selectively divides a frequency of an input pulse according to a signal level of a control signal for producing a frequency divided signal, a first programmable counter which starts counting in response to the frequency divided signal to produce a first code signal, a second programmable counter which starts counting in response to the first code signal for producing a second code signal, a first code detector for detecting a specific code signal of the first and second code signals to produce a first pulse signal, a third programmable counter which, in response to the frequency divided signal, starts to count for producing a third code signal, a second code detector for detecting a specific bit of the third code signal for producing a second pulse signal utilized as a reset signal of the first to third programmable counters, a flip-flop circuit for selectively outputting a reset or set signal in response to the first or second pulse signal, and a period counter responsive to the reset or set signal for producing a first or second level of the control signal.

5 Claims, 6 Drawing Figures

FIG_1

FIG_3

FIG_5

FIG.6

SWALLOW COUNTERS

BACKGROUND OF THE INVENTION

This invention relates to a presettable swallow counter capable of operating at a high speed.

A prior art high speed counter has been constituted by a plurality of frequency division circuits each constituted by a TTL logic circuit or an ECL logic circuit utilizing bipolar transistors, but because of its large power consumption there was a limit for a large frequency division ratio that can be obtained by cascade connecting a large number of frequency division circuits. Moreover, the temperature rise during operation is large and the area occupied by the circuit is also large so that it has been impossible to manufacture a large single chip integrated circuit.

Figure 1:
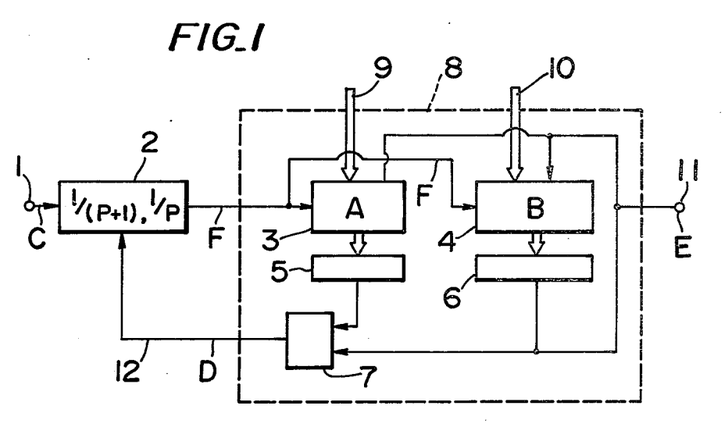
FIG. 1 is a block diagram showing a prior art presettable swallow counter.

Consequently, a swallow counter as shown in FIG. 1 which is characterized by a high operating speed and a high variable frequency ratio has been used. The overall power consumption of the frequency division circuit is small because the counter comprises a first stage counter in the form of a high speed counter (for example, a counter constituted by bipolar transistors) and a succeeding stage counter in the form of a low speed counter (for example, a counter constituted by MOS transistors). In addition, such frequency division circuit enables one to fabricate a high density integrated circuit as well as a presettable counter capable of operating at a high speed.

FIG. 1 shows a prior art presettable swallow counter comprising an input terminal 1, a 2 modulus prescaler (2 coefficient prestage frequency division circuit)2, a first programable counter 3, a second programable counter 4, a first code detector 5, a second code detector 6, a prescaler control flip-flop circuit 7, a first preset data signal input terminal 9, a second preset data signal input terminal 10, an output terminal 11, and a prescaler control signal input terminal 12. The first and second programable counters 3 and 4, the first and second code detectors 5 and 6 and the prescaler control flip-flop circuit 7 constitute a programable divider block 8.

The operation of a prior art presettable swallow counter will be described hereunder with reference to FIG. 1 on the assumption that the first and the second programable counters 3 and 4 operate as programable down counters but not as up counters. In the latter case, since it is necessary to use complements as data, for the sake of brevity this case will not be described. Although the first and second code detectors 5 and 6 can detect any value, it is assumed now that they detect a count of zero.

A pulse inputted to the input terminal 1 is supplied to the 2 modulus prescaler 2. Where the frequency division ratio of the 2 modulus prescaler 2 is selected to be P+1 by the prescaler control flip-flop circuit 7, the 2 modulus prescaler 2 reduces the frequency of the input pulse to 1/P+1 and applies its reduced frequency output to the first programable counter 3 and the second programable counter 4.

The first and second programable counters 3 and 4 are set with data in accordance with the first and second preset data signals supplied from input terminals 9 and 10. In response to the output of the 2 modulus prescaler 2, the first and second programable counters 3 and 4 begin to count down from the set values described above. The outputs of the first and second programable counters 3 and 4 are supplied to the first and second code detectors 5 and 6, respectively.

Due to the construction of the swallow counter, it is necessary to set the maximum number that can be set in the first programable counter 3 to a value less than the maximum value that can be set in the second programable counter 4.

Representing any value that can be set in the first programable counter 3 by A, and any value that can be set in the second programable counter 4 by B, the count of the first programable counter 3 becomes zero when (P+1)A pulses are applied to the input terminal 1 and this zero count is detected by the first code detector 5 for resetting the prescaler control flip-flop circuit 7.

The output of the flip-flop circuit 7 when it is reset is supplied to the 2 modulus prescaler 2 via a control signal line 12. Depending upon the level of this control signal, the ratio of frequency division of the 2 modulus prescaler 2 is switched from 1/(p+1) to 1/P.

At this time, the count of the second programable counter 4 becomes equal to B−A. Consequently, when P×(B−A) pulses are applied thereafter to the input terminal 1, the count of the second programable counter 4 becomes zero so that the second code detector 6 operates to produce a single pulse at the output terminal 1.

The output pulse of the second code detector 6 sets the prescaler control flip-flop circuit 7 to cause it to transmit a set signal to the 2 modulus prescaler 2 for changing its ratio of frequency division to 1/(p+1) from 1/P.

Furthermore, the output pulse of the second code detector 6 is inputted to the first and second programable counters 3 and 4 so that these counters 3 and 4 are preset again with values A and B respectively represented by the first and second preset data signals at the input terminals 9 and 10 respectively, whereby one period is completed so as to begin the next counting.

As can be noted from the foregoing description, the total number N of frequency division of one period of the presettable swallow counter shown in FIG. 1 is expressed by the following equation.

$$N = (P + 1) \times A + P \times (B - A)$$
$$= PA + A + PB - PA$$
$$= PB + A \text{ where } B > A.$$

As one example of the presettable swallow counter, a presettable swallow counter utilizing a decimal counter as one unit will be described hereunder together with the defects of the prior art system.

Where a binary counter is used as a unit, in the equation just described P=10 and P+1=11. Thus, the equation becomes $$N = 10B + A$$

where A is an integer of from 0 to 9 and B is an integer larger than 10.

Figure 2:
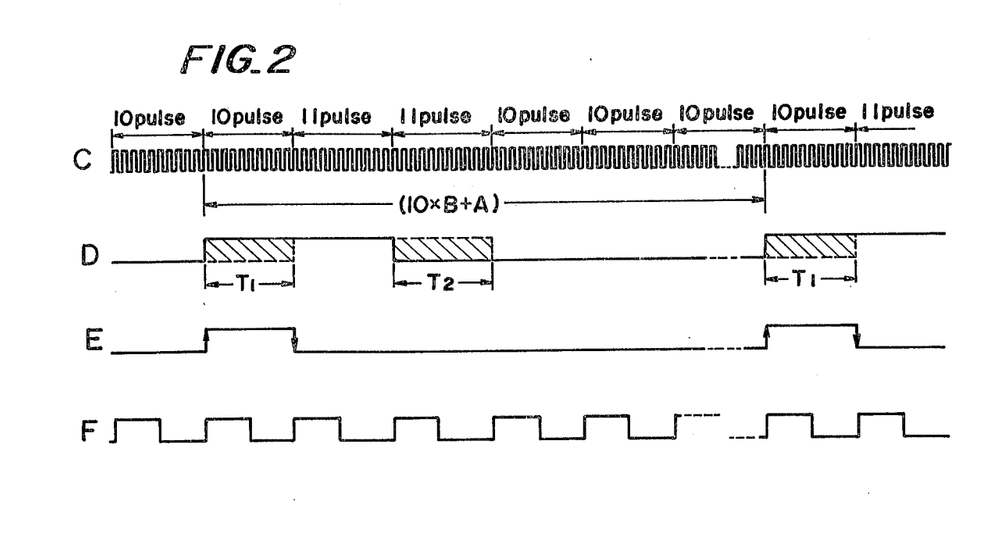
FIG. 2 is a timing chart showing waveforms at various portions of the swallow counter shown in FIG. 1.

Waveform C shown in FIG. 2 shows the input to the input terminal 1 shown in FIG. 1; waveform F shows the output pulse of the 2 modulus prescaler 2 when it is supplied with the waveform C, and waveform D shows the output signal or pulse of the prescaler control flip-flop circuit 7. Furthermore, waveform E shows the output pulse appearing at the output terminal 11 shown in FIG. 1. It should be understood that these waveforms correspond to those when 2 of the digital BCD code is set in the first programable counter 3.

Although intermediate portions of the waveforms are omitted in FIG. 2, there are (10×B+A) input pulses of the waveform C between a building up and the next building down of the waveform E.

In order to establish a counter equation $N=PB+A$ of the swallow type, the frequency is reduced to 1/11 with the 2 modulus prescaler when the prescaler control pulse shown by waveform D is at an H level, and to 1/10 when the prescaler control pulse is at an L level. The delay of the waveform D (prescaler control pulse) with respect to the waveform F (2 modulus prescaler output pulse) presents a problem.

In the waveform D shown in FIG. 2, a case wherein the delay thereof with reference to waveform F is shown by solid lines. The maximum limit necessary to hold the counter equation $N=PB+A$ of the swallow system is shown by dotted lines and the areas between solid (delay zero) and dotted lines are shown as being cross-hatched. In FIG. 2, a delay range at the time of building up of the waveform D is shown by $T_1$, and the range at the time of building down of the waveform D is shown by $T_2$.

Where the presettable swallow counter is used for decreasing the frequency in a radio frequency band, the input frequency would be 130 MHz at the maximum (actually it is 120 MHz, the difference 10 MHz is a margin). For this reason, times $T_1$ and $T_2$ are expressed as follows:

$$T_1 = \frac{1}{\frac{130 \text{ MHz}}{10}} = 76.923 \ldots \approx 77 \text{ ns}$$

$$T_2 = \frac{1}{\frac{130 \text{ MHz}}{11}} = 84.6153 \ldots \approx 85 \text{ ns}.$$

This means that it is necessary to limit the delay of the prescaler control pulse with reference to the prescaler output pulse to be shorter than these times. If the delay of the prescaler control pulse with reference to the prescaler output pulse becomes larger than these times, either one of the interval 1/11 or 1/10 becomes longer thus resulting in an abnormal frequency division which causes a count error.

Where the 2 modulus prescaler 2 shown in FIG. 1 is constituted by an ECL while the other programable divider block 8 is constituted by a C-MOS, the frequency division of the input frequency 130 MHz can efficiently be realized with the ECL. However, with C-MOS, in view of the varieties in the source voltage and the ambient temperature, the delay of the prescaler control pulse with reference to the prescaler output pulse should be 250 ns at the minimum so that switching of the frequency division in such short delay time of less than $T_1=77$ ns and $T_2=85$ ns is practically impossible.

Accordingly, according to the prior art system, due to the delay time of the low speed counter in the later stage, the potential performance of the prescaler cannot be manifested sufficiently, thus limiting the overall characteristics of the swallow counter.

SUMMARY OF THE INVENTION

Accordingly, it is an object of this invention to provide an improved swallow counter capable of widening the delay range of the prescaler control pulse (output signal of the flip-flop circuit) with reference to the prescaler output pulse (a first frequency division signal).

Another object of this invention is to provide a swallow counter capable of operating at high frequencies without misoperation.

According to this invention, there is provided a swallow counter comprising a two modulus prescaler which produces a frequency divided signal obtained by selectively dividing a frequency of input pulse signal by 1/P or 1/(P+1) (where P is an integer) in accordance with a first or second level of a control signal; a first programable counter having a predetermined maximum count, the counter starting counting from a set value designated by a first preset data signal in response to the frequency divided signal for producing a first code signal; a second programable counter responsive to a most significant bit of the first code signal for starting counting from a set value designated by a second preset data signal so as to produce a second code signal; a first code detector for detecting a specific code signal of the first and second code signals for producing a first pulse signal; a third programable counter responsive to the frequency divided signal for starting counting from a set value designated by a third preset data signal so as to produce a third code signal; a second code detector which detects a specific bit of the third code signal for producing a second pulse for a predetermined interval, the second pulse signal being utilized as a preset signal of the first, second and third programable counters; a flip-flop circuit responsive to the first or second pulse signal for selectively outputted a reset signal or a set signal; and means which produces the first signal level of the control signal when the reset signal is applied to the means, whereas when the set signal is applied produces the second signal level of the control signal each time the frequency divided signal of a number equal to the predetermined maximum count is applied to the means but produces the first signal level of the control signal in other intervals.

DESCRIPTION OF THE PREFERRED EMBODIMENTS

Figure 3:
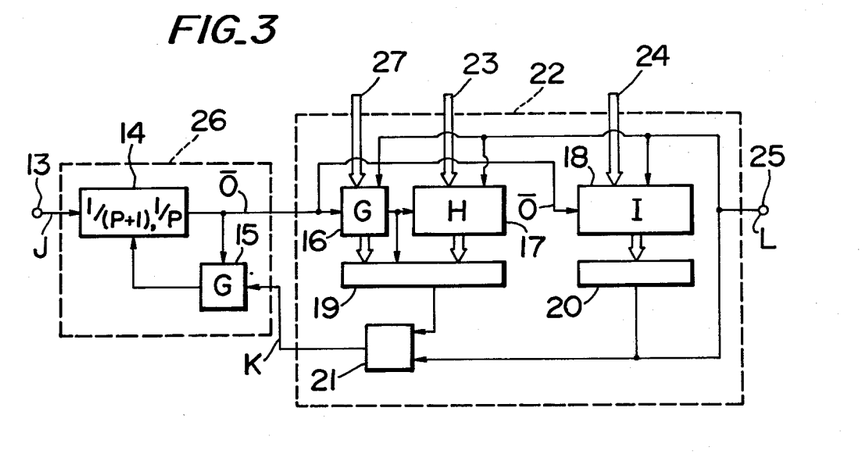
FIG. 3 is a block diagram showing one embodiment of the presettable swallow counter according to this invention.

A presettable swallow counter of this invention shown in FIG. 3 is provided with an input terminal 13 and an input pulse signal inputted thereto is supplied to the input of a 2 modulus prescaler 14 which produces a first frequency divided signal obtained by selectively dividing the frequency of the input pulse signal by 1/P or 1/(P+1) (where P is an integer) in accordance with the first or second signal level of a control signal supplied from a period counter to be described later. The first frequency divided signal is supplied to the input terminals of a period counter 15, a first programable counter 16 and a third programable counter 18.

To the first and third programable counters 16 and 18 are supplied first and third preset data signals respectively from first and third preset data signal input terminals 27 and 24. Accordingly, the first and third programable counters 16 and 18 count the first frequency divided signal starting from values set by the first and third preset signals to produce first and third code signals, respectively.

There is provided a second programable counter 17 which is supplied with the most significant bit of the first code signal from the first programable counter 16, and with a second preset data signal from a second preset data signal input terminal 23. Consequently, the second programable counter 17 counts the most significant bit of the first code signal starting from a set value designated by the second preset data signal to produce a second code signal.

A first code detector 19 is supplied with the first and second code signals for detecting specific code signals thereof to output a first pulse signal.

The third code signal is supplied to a second code detector 20 which detects a specific code signal of the third code signal to produce a second pulse signal for a predetermined interval. The second pulse signal appears at the output terminal 25 and is supplied to the first to third programable counters 16, 17 and 18 as a reset signal.

A prescaler control flip-flop circuit 21 is reset by the first pulse signal to produce a reset signal or is set by the second pulse signal to produce a set signal, the reset and set signals thus produced being supplied to the period counter 15.

When supplied with the set signal from the prescaler control flip-flop circuit 21, the period counter 15 produces the second level control signal at a rate of once per G periods by using the first frequency divided signal outputted from the 2 modulus prescaler 14 as a clock pulse, whereas in the other case, that is; during periods (G−1) of the G periods, produces the first signal level of the control signal. But when supplied with the reset signal from the prescaler control flip-flop circuit 21, the counter 15 always produces the first level control signal. As a consequence, when the period counter 15 is supplied with the set signal from the prescaler control flip-flop circuit 21, the 2 modulus prescaler 14 performs a frequency division 1/(P+1) at a rate of once per G periods by using the output of 2 modulus prescaler 14 as a clock pulse, while in the other case, that is; during periods (G−1), performs a frequency division of 1/P. But, when supplied with the reset signal from the prescaler control flip-flop circuit 21, the 2 modulus prescaler 14 is always controlled to perform a frequency division of 1/P.

The period counter 15 and the 2 modulus prescaler 14 described above constitute a 2 cycle modulus prescaler block 26. On the other hand, the first to third programable counters 16, 17 and 18, the first and second load detectors 19 and 20 and the prescaler control flip-flop circuit 21 constitute a programable divider block 22. The 2 cycle modulus prescaler block 26 is constituted by bipolar type transistors, while the programable divider block 22 is constituted by MOS transistors.

The operation of the presettable swallow counter will be described later. In the same manner as in the prior art circuit the first to third programable counters 16, 17 and 18 operate as programable down counters. Although the first and second code detectors 19 and 20 can detect any values (any specific code signals), it is herein assumed that the detected count is zero.

The first programable counter 16 comprises G steps or stages (although G may be any integer it has the same value as the G of the G period counter 15 so that in the following description it is assumed that all Gs have the same value). Furthermore, it is assumed that a value G times of the maximum value set in the second programable counter 17 is less than the minimum value set in the third programable counter 18. In other words, this means that the maximum presettable frequency division ratio obtainable by the first and second programable counters 16 and 17 is smaller than the minimum frequency division ratio of the third programable counter 18.

Let us denote any value set in the first programable counter 16 by P (in this case P=0), any value set it the second programable counter 17 by H and any value set in the third programable counter 18 by I. At first, it is assumed that the 2 modulus prescaler 14 performs a frequency division of 1/(P+1) at a rate once in the G period and that the prescaler 14 performs a frequency division of 1/P in other periods.

Under these states, each time $$\left( \frac{P+1}{G} + \frac{P(G+1)}{G} \right)$$

input pulse signals are inputted to the input terminal 13, the 2 modulus prescaler 14 produces a single pulse (first frequency divided signal). Assume now that any value P initially set in the first programable counter 16 is zero. Then, when $$\left( \frac{P+1}{G} + \frac{P(G-1)}{G} \right) \times G \times H = PGH + H$$

input pulse signals are inputted to the input terminal 13, the outputs (first and second code signals) of the first and second programable counters 16 and 17 become a zero count (specific code signal) which is detected by the first code detector 19 for resetting the prescaler control flip-flop circuit 21.

The reset output of this flip-flop circuit 21 is sent to the period counter 15. In response to the level of this reset output signal, the period counter 15 controls the 2 modulus prescaler 14 such that it would always perform a frequency division of 1/P, the prescaler having performed a frequency division of 1/(P+1) at a rate of once during the G period and a frequency division of 1/P in other periods.

At this time, the value of the output of the third programable counter 18 (third code signal) is less than I by (G×H). Because, as above described, a value of G times of the maximum value set in the second programable counter 17 was determined to be less than the minimum value set in the third programable counter 18. Accordingly, when P×(I−GH) input pulse signals are thereafter inputted to the input terminal 13, the count (the third code signal) of the third programable counter 18 becomes zero (a specific code signal) so that the second code detector 20 operates to produce a single pulse (second pulse signal) at the output terminal 25.

The output pulse from the second code detector 20 sets the prescaler control flip-flop circuit 21 and its set signal releases the reset state of the period counter 15. As a consequence, the period counter 15 again controls the 2 modulus prescaler 14 such that it performs the frequency division of 1/(P+1) at a rate of one per G periods and the frequency division of 1/P in other periods.

Furthermore, the output pulse of the second code detector 20 is supplied to the first, second and third programable counters 16, 17 and 18 so that these counters repeat their cycles in which values P (in this case 0), H and I represented by the first, second and third preset data signals at input terminals 27, 23 and 24 are preset again to complete one period and then begin their new counting operations.

As can be noted from the foregoing description, the total number N of the frequency division in one period of the presettable swallow counter shown in FIG. 3 is expressed by the following equation:

$$M = PGH + H + P \times (I - GH)$$
$$= PGH + HPI - PGH$$
$$= PI + H \text{ (where } I > G \times H\text{)}.$$

As one example of the presettable swallow counter, a presettable swallow counter comprising decimal unit counters and capable of obviating defects of the prior art counter will now be described.

Where a decimal counter is used as a unit in the equation just described $P=10$ and $P+1=11$. Then, the equation becomes:

$$M = 10I + H$$

This means that an integer of 0 to 9 is used for H and an integer larger than $G \times 10$ is used for I, where G represents the number of stages of the period counter 15 and the first programable counter 16.

Figure 4:
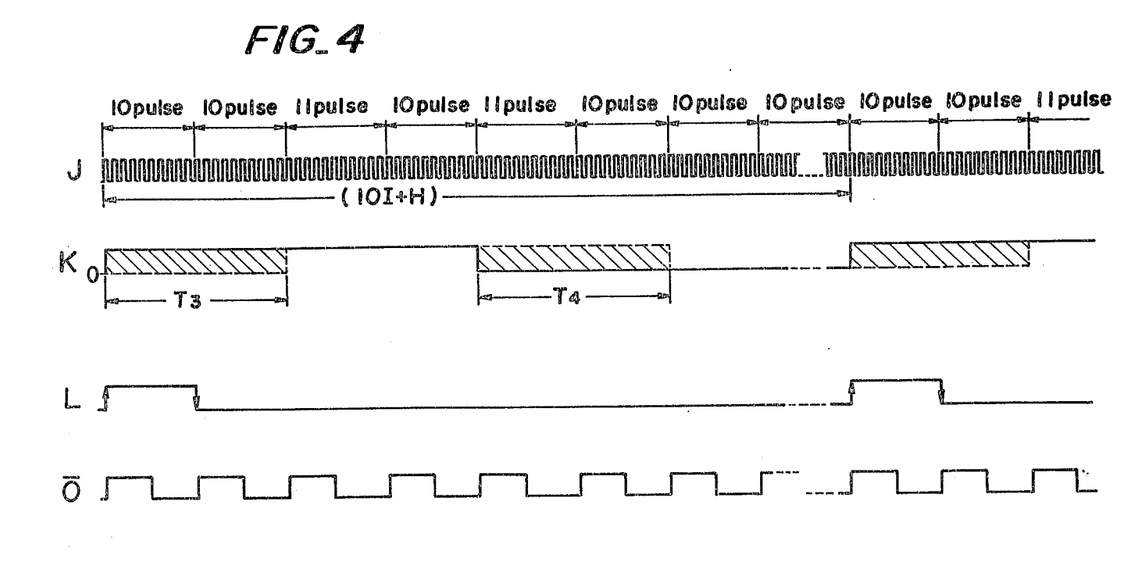
FIG. 4 is a timing chart showing waveforms at various portions of the presettable swallow counter shown in FIG. 3.

The output pulse of the 2 modulus prescaler 14 shown in FIG. 3 when a waveform J shown in FIG. 4 is applied to input terminal 13 is shown by waveform $\overline{O}$ shown in FIG. 4, and the output signal (prescaler control pulse) of the prescaler control flip-flop circuit 21 is shown by waveform K shown in FIG. 4. The output pulse appearing at the output terminal 25 shown in FIG. 3 is shown by waveform L shown in FIG. 4. It is assumed now that the value set in the second programable counter 17 is 2, that the value set in the first programable counter 16 is 0, that the number of periods of the period counter 15 is 2 and that the first programable counter 16 comprises a binary counter.

Although the intermediate portions of the waveforms shown in FIG. 4 are omitted, there are (10I+H) waveforms J (input pulse signal) between a building up of the waveform I and the next building up thereof. When the prescaler control pulse (waveform K) is at the H level, the 2 modulus prescaler 14 alternately performs frequency divisions of 1/10 and 1/11 (because the values of the period counter 15 and the frequency division circuit are 2), whereas when the prescaler control pulse is at the L level, the 2 modulus prescaler 14 performs a frequency division of 1/10.

In the waveform K shown in FIG. 4, a case in which the delay of the waveform K (prescaler control pulse) from the waveform $\overline{O}$ (the output pulse of the 2 modulus prescaler 14) is zero is shown by solid lines, whereas a maximum limit line wherein the delay from the waveform $\overline{O}$ satisfies the equation $M = PI + H$ is shown by dotted lines and areas between the maximum limit line and a zero line are crosshatched. The effective delay interval at the time of building up of the waveform K is represented by $T_3$, and the delay effective interval at the time of the building down of the waveform K is represented by $T_4$.

Thus, where the input frequency (that of the waveform J shown in FIG. 4) is equal to 130 MHz.

$$T_3 = \frac{1}{\frac{130 \text{ MHz}}{10}} \times 2 = 153.846\ldots \approx 154 \text{ ns.}$$

$$T_4 = \frac{1}{\frac{130 \text{ MHz}}{11}} + \frac{1}{\frac{130 \text{ MHz}}{10}} \approx 162 \text{ ns.}$$

This shows that the effective delay interval is increased to about twice that of the prior art circuit. These values are obtained when the number of periods of the period counter 15 and the number of steps of the first programable counter 16 are made to be 2 respectively, and these values increase when the value of G is increased as 3, 4, 5, ...

Generally speaking, where an N step counter is used as a unit, the maximum input frequency is $f_{IN}$, and the number of periods of the period counter 15 and the number of steps of the first programable counter are both G, the delay time (the delay of the building up of the pulse is represented b $T_{LH}$, and the delay of the building down of the pulse is represented by $T_{HL}$) of the prescaler control pulse from the prescaler output pulse is shown by the following equation:

$$T_{LH} = \frac{1}{\frac{f_{IN}}{N}} \times G$$

$$T_{HL} = \frac{1}{\frac{f_{IN}}{N+1}} + \frac{1}{\frac{f_{IN}}{N}} \times (G - 1)$$

Consequently, where the input frequency is equal to 130 MHz, a decimal counter is used as a unit, the value of G that makes both $T_{LH}$ and $T_{HL}$ to be more than 250 ns becomes larger than 4.

$$T_{LH} = \frac{1}{\frac{130 \text{ MHz}}{10}} \times 4 = 308 \text{ ns}$$

$$T_{HL} = \frac{1}{\frac{130 \text{ MHz}}{11}} + \frac{1}{\frac{130 \text{ MHz}}{10}} \times 3 = 316 \text{ ns.}$$

These values can readily be obtained even when the 2 modulus scaler 14 shown in FIG. 3 and the period counter 15 are made of ECLs and the programable divider block 22 is made of a C-MOS and even when the source voltage of the C-MOS and ambient temperature vary.

Accordingly, the presettable swallow counter shown in FIG. 3 operates correctly even with a high frequency input (130 MHz) which cannot be applied to the prior art swallow counter, thus enabling the C-MOS to operate correctly up to the highest input frequency (30 MHz for a high speed C-MOS).

As above described, with the swallow counter embodying the invention, as it is possible to increase to any value the effective delay time of the output signal of a flip-flop circuit with respect to the first frequency divided signal produced by the 2 modulus prescaler according to the period of a period counter and the number of stages of a first programable counter, even when the 2 modulus prescaler and the period counter are made of ECLs, while the first to third programable counters, first and second code detectors, and the flip-flop circuit are made of C-MOSs it is possible to correctly count an input of such a high frequency (about 130 MHz) that causes miscounting. Consequently, the swallow counter of this invention can be efficiently used in such high speed frequency division counter as PLLs for tuning radio or television waves which are sent at high frequencies.

Figure 5:
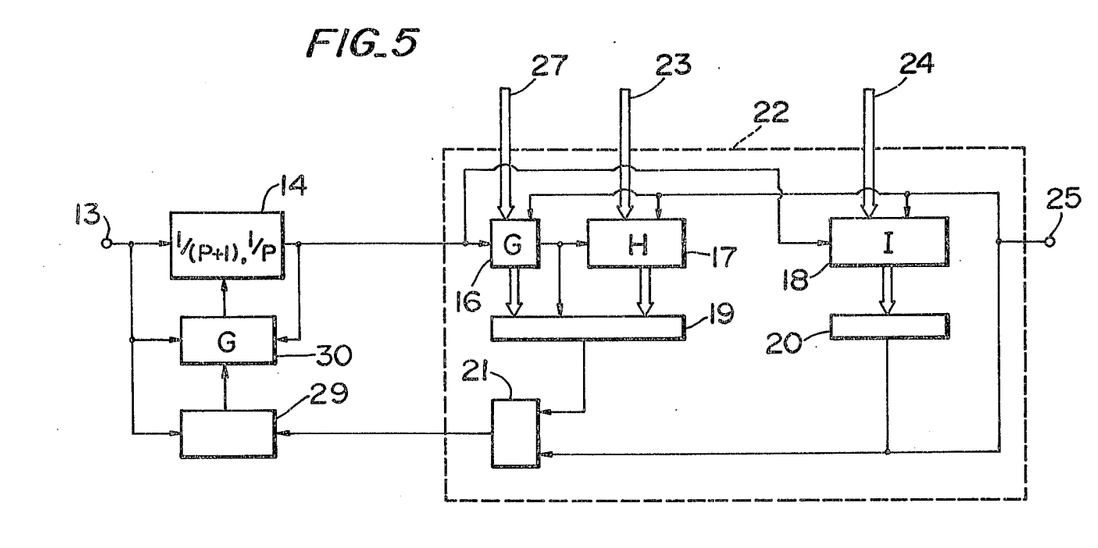
FIG. 5 is a block diagram showing another embodiment of this invention.

FIG. 5 is a block diagram showing a modified swallow counter in which elements identical to those shown in FIG. 3 are designated by the same reference characters.

This modification is different from the previous embodiment shown in FIG. 3 in that an input signal supplied to the input terminal 13 is also supplied to a period counter 30 and a digital extender 29 which is supplied with the output of the prescaler control flip-flop circuit 21, that the period counter 30 is supplied with the outputs of the digital extender 29 and the 2 modulus prescaler 14 and that the output of the period counter 30 is supplied to the 2 modulus prescaler 14.

With this construction, the 2 modulus prescaler 14 divides the frequency of the input pulse to produce a first frequency divided signal having a frequency controlled by the level of a control signal outputted from the period counter 30. More particularly, when the control signal is at a first signal level, the 2 modulus prescaler divides the frequency of the input pulse to 1/P (where P is an integer) whereas when the control input signal is at a second signal level, the 2 modulus prescaler divides the frequency of the input pulse to 1/(P+1) during a predetermined interval.

When supplied with a reset signal from the prescaler control flip-flop circuit 21, the digital extender 29 delays the reset signal for a predetermined interval in accordance with the input pulse inputted to the input terminal 13. On the other hand when supplied with a set signal from the prescaler control flip-flop circuit 21, the digital extender 29 produces the set signal in synchronism with the input pulse without delaying.

The reset or set signal outputted from the digital extender 29 is applied to the period counter 30 which is reset by the reset signal to produce the first signal level of the control signal. Whereas, when the set signal is supplied the reset state of the period counter 30 is released to switch the first signal level of the control signal having a period determined by the number of the input signals to the second signal level at each period G in accordance with the first frequency divided signal outputted from the 2 modulus prescaler 14. More particularly, under the control of the digital extender 29, the period counter 30 switches the two states of the 2 modulus prescaler 14. In the first state, a frequency division of 1/P is always performed while in the second state frequency division of 1/(P+1) is performed once in G periods by utilizing the first frequency divided signal outputted by the 2 modulus prescaler 14 as a clock pulse, while during the periods G a frequency division of 1/P is performed once in (G−1) periods.

The period counter 30, the 2 modulus prescaler 14, and the digital extender 29 are constituted by bipolar type transistors. On the other hand, the first through third programable counters 16, 17 and 18, the first and second code detectors 19 and 20, and the prescaler control flip-flop circuit 21 constitute a programable divider block 22 fabricated with MOS transistors.

The operation of the modified presettable swallow counter shown in FIG. 5 will now be described. Similar to the prior art swallow counter, the first to third programable counters 16, 17 and 18 operate as programable down counters. Although the first and second code detectors 19 and 20 can detect any value (any specific code signal), it is assumed herein that they detect a count zero.

The first programable counter 16 has G stages (The value of G may be any integer but the same as the G of the G period counter 30. In the following description it should be understood that all Gs have the same value). It is also assumed that G times of the maximum value set in the second programable counter 17 is less than the minimum value set in the third programable counter 18. In other words, a synthesized presettable maximum divided frequency obtained by the first and second programable counters 16 and 17 is smaller than the minimum divided frequency of the third programable counter 18.

Let us denote any value set in the first programable counter 16 by P (in this example P=0), any value set in the second programable counter 17 by H and any value set in the third programable counter 18 by I. Furthermore, it is assumed that the 2 modulus prescaler 14 performs a frequency division of 1/(P+1) at a rate of once per G periods, while a frequency division of 1/P at a rate of (G−1) times per G periods.

Under these states, each time $$\left( \frac{P+1}{G} + \frac{P(G-1)}{G} \right)$$

input pulse signals are inputted to the input terminal 13, the 2 modulus prescaler 14 produces one pulse (first frequency divided signal). Suppose now that any value P to be initially set in the first programable counter 16 is zero. Then, when $$\left( \frac{P+1}{G} + \frac{P(G-1)}{G} \right) \times G \times H$$

input pulses are inputted to the input terminal 13, the outputs (first and second code signals) to the first and second programable counters 16 and 17 are both zero counts (specific code signal) which are detected by the first code detector 19 to reset the prescaler control flip-flop circuit 21.

The reset output signal of this flip-flop circuit 21 is supplied to the digital extender 29 in which the reset signal is subjected to a clock synchronous delay in accordance with the input pulse signal supplied to the input terminal 13. The optimum delay in this case is equal to P/2 pulse width of the input pulse signal where P is equal to the P of the frequency division 1/P effected by the 2 modulus prescaler 14. The reset signal thus delayed is supplied to the period counter 30 for resetting the same. As a consequence, the period counter 30 controls the 2 modulus prescaler 14 such that it performs only the frequency division of 1/P, the frequency division of the 2 modulus prescaler 14 having been periodically switched between 1/(P+1) and 1/P.

At this time, (G×H) input pulse signals are supplied to the third programable counter 18. Consequently, when P×(I−GH) input pulse signals are thereafter inputted to the input terminal 13, the count (third code signal) of the third programable counter 18 becomes zero (specific code signal), whereby the second code detector 20 produces one pulse (second pulse signal) at the output terminal 25. The output pulse of the second code detector 20 sets the prescaler control flip-flop circuit 21 to cause it to transmit its set signal to the digital extender 29. In this case, after being synchronized with the input pulse signal at the input terminal 13 and without being delayed, the set signal is outputted from the digital extender 29 and then applied to the period counter 30. Consequently, the reset state of the period counter 30 is released so that the 2 modulus prescaler 14 performs a frequency division of 1/(P+1) at a rate of once per G periods and a frequency division of 1/P at a rate of (G−1) during the periods G.

The output of the second code detector 20 is supplied to the first, second and third programable counters 16, 17 and 18 so that they are preset again with values P(in this case 0), H and I represented by the first, second and third preset data signals supplied to the input terminals 27, 23 and 24 respectively. Accordingly, the first, second and third programable counters 16, 17 and 18 complete one period and repeat succeeding counting operations.

As can be noted from the foregoing description, the total number M of frequency division in one period of the presettable swallow counter shown in FIG. 5 is expressed by:

$$M = PGH + H + P \times (I - G \times H)$$
$$= PI + H \text{ where } I > G \times H.$$

This is the general equation of the presettable swallow counter shown in FIG. 5.

As one example of the presettable swallow counter described above, a presettable swallow counter including a decimal counter as a unit will be described to show that it can eliminate the defect of the prior art swallow counter.

Where a decimal counter is utilized as a unit, in the general equation $M = PI + H$ described above, the value P becomes 10. Thus, the equation becomes:

$$M = 10I + H$$

Consequently, it becomes possible to use an integer larger than G×10 as I and an integer of from 0 through 9 as H, where G represents the period of the period counter 30 as well as the number of stages of the first programable counter 16.

Figure 6:
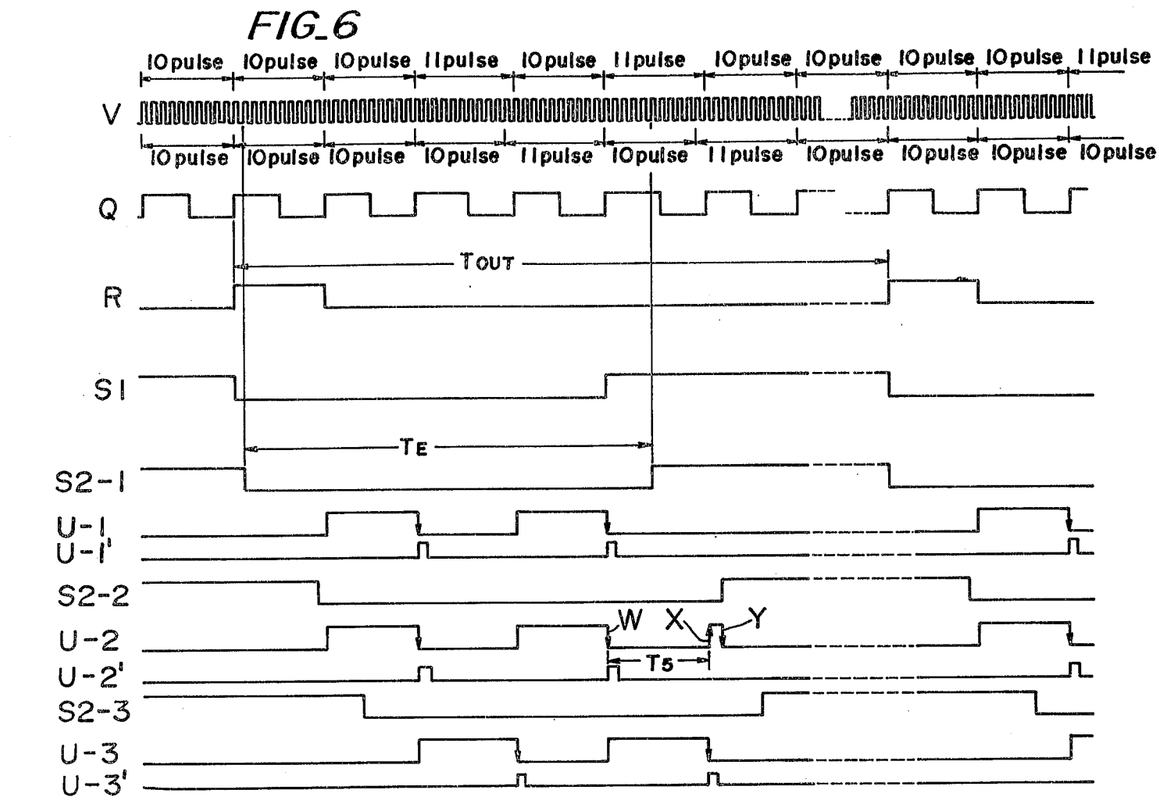
FIG. 6 is a timing chart showing waveforms at various portions of the modified embodiment shown in FIG. 5.

In the timing chart shown in FIG. 6, V represents the input pulse signal waveform inputted to the input terminal 13, Q the output pulse waveform of the 2 modulus prescaler 14, R the output pulse appearing at the output terminal 25, S1 the output signal (prescaler control pulse) of the prescaler control flip-flop circuit 21, S2-1, S2-2, S2-3 the output signal waveforms of the digital extender 29, U-1, U-2 and U-3 the operating waveforms of the period counter 30 and U-1', U-2' and U-3' the output control signals of the period counter 30. In this case, the data to be preset in the first programable counter 16 is 0, the data to be preset in the second programable counter 17 is 2, the periods of the period counter 30 is 2 and the first programable counter 16 comprises a binary counter.

Waveforms S2-1, U-1 and U-1' shown in FIG. 6 represent a case wherein the delay of the prescaler control pulse (waveform S1) with respect to the output pulse (waveform Q) of the 2 modulus prescaler 14 is zero. Actually, however, since there is a delay caused by circuit elements (first to third programable counters 16, 17, 18; first and second code detectors 19,20; and prescaler control flip-flop circuit 21) with reference to the frequency of the input pulse signal (waveform V), as the frequency of the input pulse signal increases, waveforms S2-2, U-2, U-2', S2-3, U-3 and U-3' shown in the timing chart tend to shift to the right.

Waveforms S2-1, U-1 and U-1' will firstly be considered. The waveform S2-1 is obtained by synchronizing the waveform S1 of the prescaler control pulse with the input pulse signal (waveform V). However, the pulse is made to build up after 5 pulses of the input pulse signal (waveform V) because the optimum value of P/2 is used. The delay or extension is not limited to 5 pulses but may be 3, 4, 6 or 7 pulses.

Due to this delay, the number of building up of the output pulses (waveform Q) of the 2 modulus prescaler 14 becomes always 4 during an interval in which the output signal (waveform S2-1) of the digital extender 29 is at the L level. Thus, the period counter 30 is released from the reset state during the L level interval of the waveform S2-1 to count four times to perform the operation shown by waveform U-1.

When the number of the frequency divisions of the 2 modulus prescaler 14 is increased by one by the control signal having the waveform U-1' immediately after building down of the waveform U-1, the equation $$M = 10I + H \text{ (general equation } M = PI + H\text{)}$$

can be satisfied (in the case shown in FIG. 6, H=2) so that (10I+H) input pulse signals having a waveform V will be included in one period of the output pulse (waveform R).

Since the prescaler control pulse (waveform S1) has been delayed with respect to the prescaler output pulse (waveform Q), where the output signal waveform of the digital extender 29 becomes S2-2, during an interval in which the waveform is at the L level, the period counter 30 becomes operative to count at the time of building up of the output pulse (waveform Q) of the 2 modulus prescaler 14. Thus, the period counter 30 operates as shown by waveform U-2.

The number of frequency divisions of the 2 modulus prescaler 14 is increased by one immediately after the building down of the waveform U-2, but in the case where the waveform U-2 is Y the waveform S2-2 becomes the H level to reset the period counter 30. As a consequence, the waveform U-2' does not build up and the frequency division of the 2 modulus prescaler 14 would not become 1/11 but become 1/10. Thus, during one period of all counters the number of frequency divisions is increase only two so that the circuit operates as an ordinary presettable swallow counter. According to a method in which the building down of the output of the period counter is detected, the counting is made where waveform U-2 is Y, so that the number of frequency divisions increases by one.

In contrast, according to the presettable swallow counter shown in FIG. 6 since not only the period counter 30 but also the build down detector of the output of the period counter 30 are reset, the building down of Y would not be detected, thus avoiding miscounting.

Even when the building down of the output of the period counter 30 is detected to switch the frequency division of the 2 modulus prescaler 14, the output pulse (waveform Q) of the prescaler 14 is not supplied to the period counter during an interval between the second building down (W) of the waveform U-2 and the building up (X) at the next time, or to reset the period counter. With these measures, however, the delay effective interval would be limited to $T_5$ shown in FIG. 6.

Where the prescaler control pulse (waveform S1) is further delayed with respect to the prescaler output pulse (waveform Q) and then inputted to the digital extender 29, the output waveform of the digital extender 29 is shown by S2-3.

Even under these states, the circuit operates in the same manner as above described. Thus, the period counter 30 operates as shown by waveform U-3 and by transmitting to the 2 modulus prescaler 14 waveform U-3' obtained by detecting the building down of the waveform U-3, the presettable swallow counter operates normally.

In the same manner, even when the prescaler control pulse (waveform S1) is delayed to a point immediately prior to the building up of the next output pulse (waveform R), the counter can count normally so that the delay effective period of the prescaler control pulse (waveform S1) with reference to the prescaler output pulse (waveform Q) is never influenced by the delays of the circuit elements constituting the first to third presettable programable counters 16, 17, 18, first and second code detectors 19, 20, and the prescaler control flip-flop circuit 21.

Explaining with concrete data, assume now that the input frequency is 130 MHz, that the set value of the first programable counter 16 is P=0, that the set value of the second programable counter 17 is H=2, and that the set value of the third programable counter 18 is I=100. Then, the total number M of frequency divisions becomes $$M = 1002,$$

and the output frequency becomes $$f_{OUT} = \frac{130 \text{ MHz}}{1002} \approx 129741 \text{ Hz (about 129.741 KHz)}$$

Thus, the output frequency becomes $$T_{OUT} \approx 7.7 \times 10^{-6} S = 7.7 \text{ } \mu s.$$

Where 2 is set in the second programable counter 17, even when the delay of the prescaler control pulse (waveform S1) with reference to the prescaler output pulse (waveform Q) is zero second, the minimum interval $T_E$ in which the output signal of the digital extender 29 is at the L level becomes $$T_E \approx 0.354 \text{ } \mu s.$$

As a consequence, the delay effective interval becomes $$T_D = T_{OUT} - T_E \approx 7.346 \text{ } \mu s.$$

Accordingly, even when the programable divider block 22 is fabricated with C-MOS, IIL or the like it would not be influenced by the variations in the source voltage and ambient temperature.

As described above, since in the embodiment shown in FIG. 5, a digital extender is added to the embodiment shown in FIG. 3, it is possible to extend the delay effective interval of the prescaler control pulse, that is the output of the flip-flop circuit with reference to the prescaler output pulse (first frequency divided signal) to one period (an interval $T_{OUT} - T_E$ shown in FIG. 6) of the output pulse of the programmable divider block 22. Accordingly, when the 2 modulus prescaler, the period counter and the digital extender are fabricated with such element as ECL or TTL that can operate at a high speed and when the programable divider block 22 is fabricated with such elements as C-MOS or IIL that can operate at a low speed it becomes possible to count normally even in a frequency band (about 130 MHz) in which the prior art swallow counter miscounts so that it is impossible to operate normally. Thus, the counter shown in FIG. 5 can be advantageously used as such high speed frequency division counter as high frequency PLL used as a radio receiver tuner (maximum, about 130 MHz) and a television receiver tuner (maximum, about 1 GHz).

What is claimed is:

1. A swallow counter comprising:
    a two modulus prescaler which produces a frequency divided signal obtained by selectively dividing a frequency of an input pulse signal by 1/P or 1/(P+1) (where P is an integer) in accordance with a first or second level of a control signal;
    a first programable counter having a predetermined maximum count, said counter starting counting from a set value designated by a first preset data signal in response to said frequency divided signal for producing a first code signal;
    a second programable counter responsive to a most significant bit of said first code signal for starting counting from a set value designated by a second preset data signal so as to produce a second code signal;
    a first code detector for detecting a specific code signal of said first and second code signals for producing a first pulse signal;
    a third programable counter responsive to said frequency divided signal for starting counting from a set value designated by a third preset data signal so as to produce a third code signal;
    a second code detector which detects a specific bit of said third code signal for producing a second pulse for a predetermined interval, said second pulse signal being utilized as a preset signal of said first, second and third programable counters;
    a flip-flop circuit responsive to said first or second pulse signal for selectively outputting a reset signal or a set signal; and
    a means which produces the first signal level of said control signal when said reset signal is applied to said means, whereas when said set signal is applied produces the second signal level of said control signal each time said frequency divided signal of a number equal to said predetermined maximum count is applied to said means but produces the first signal level of said control signal in other intervals.

2. The swallow counter according to claim 1, wherein said last mentioned means comprises a period counter connected between said two modulus prescaler and said flip-flop circuit.

3. The swallow counter according to claim 1, wherein said last mentioned means comprises a digital extender supplied with an output of said flip-flop circuit and said input pulse signal, a period counter connected to receive said frequency divided signal, said input pulse signal and an output of said digital extender and means for applying an output of said period counter to said two modulus prescaler.

4. The swallow counter according to claim 1, wherein a presettable maximum frequency division ratio obtainable with said first and second programmable counters is smaller than a minimum frequency division ratio of said third programmable counter.

5. The swallow counter according to claim 1, wherein said two modulus prescaler and said last mentioned means comprise high speed logic means, while said first, second and third programmable counters, said first and second code detectors and said flip-flop circuit comprise low speed logic means.

* * * * *